United States Patent
Ohashi et al.

(10) Patent No.: US 9,289,753 B2
(45) Date of Patent: Mar. 22, 2016

(54) SUBSTRATE FOR CARBON NANOTUBE GROWTH AND METHOD FOR MANUFACTURING THE SAME

(71) Applicant: HONDA MOTOR CO., LTD., Tokyo (JP)

(72) Inventors: Toshiyuki Ohashi, Wako (JP); Toshio Tokune, Wako (JP); Masahiro Ohta, Wako (JP); Ryogo Kato, Wako (JP); Toshiyuki Shima, Tagajo (JP)

(73) Assignee: HONDA MOTOR CO., LTD., Tokyo (JP)

( * ) Notice: Subject to any disclaimer, the term of this patent is extended or adjusted under 35 U.S.C. 154(b) by 0 days.

(21) Appl. No.: 14/095,447

(22) Filed: Dec. 3, 2013

(65) Prior Publication Data

US 2014/0155251 A1    Jun. 5, 2014

(30) Foreign Application Priority Data

Dec. 4, 2012  (JP) ................................. 2012-265824
Nov. 28, 2013 (JP) ................................. 2013-246432

(51) Int. Cl.
| | | |
|---|---|---|
| C23C 14/34 | (2006.01) |
| B01J 23/78 | (2006.01) |
| B01J 37/02 | (2006.01) |
| B01J 37/34 | (2006.01) |

(Continued)

(52) U.S. Cl.
CPC ................ B01J 23/78 (2013.01); B01J 23/745 (2013.01); B01J 37/0244 (2013.01); B01J 37/342 (2013.01); B82Y 30/00 (2013.01);

(Continued)

(58) Field of Classification Search
CPC ...... B01J 23/78; B01J 23/745; B01J 37/0244; B01J 37/342; B82Y 30/00; B82Y 40/00; C23C 14/5893

USPC ........ 204/192.12, 192.15; 502/300, 326, 334, 502/336, 338, 339, 439; 429/487, 524, 527, 429/529, 532

See application file for complete search history.

(56) References Cited

U.S. PATENT DOCUMENTS 7,361,426 B2 * 4/2008 Pan ............................... 429/535
8,476,719 B2 * 7/2013 Endo et al. .................... 257/412

(Continued)

FOREIGN PATENT DOCUMENTS

JP          2008-037670          2/2008

OTHER PUBLICATIONS

Guang, Xiong et al, Aligned millimeter-long carbon nanotube arrays grown on single crystal magnesia, Carbon 44 (2006) p. 969-973.*

(Continued)

*Primary Examiner* — John Brayton
(74) *Attorney, Agent, or Firm* — Rankin, Hill & Clark LLP

(57) ABSTRACT

Provided is a substrate for carbon nanotube growth in which no metal particles as a catalyst aggregates and a method for manufacturing the substrate. A substrate for carbon nanotube growth 1 includes a base plate 2, a catalyst 3, a form-defining material layer 4 which allows the catalyst 3 to be dispersed and arranged, and a covering layer 5 which has a metal oxide to cover the catalyst. A method for manufacturing a substrate for carbon nanotube growth 1 includes a step of sputtering on a base plate 2 a metal which forms a catalyst 3 and oxidizing the surface of the metal, a step of sputtering a form-defining material on the base plate 2, and a step of further sputtering on the form-defining material a metal which forms a catalyst 3 and oxidizing the surface of the metal.

10 Claims, 5 Drawing Sheets

(51) Int. Cl.
  *B01J 23/745* (2006.01)
  *B82Y 30/00* (2011.01)
  *B82Y 40/00* (2011.01)
  C23C 14/08 (2006.01)
  C23C 14/18 (2006.01)
  C23C 14/58 (2006.01)

(52) U.S. Cl.
  CPC ............ *B82Y 40/00* (2013.01); *C23C 14/5893* (2013.01); *C23C 14/081* (2013.01); *C23C 14/18* (2013.01); *C23C 14/5853* (2013.01)

(56) References Cited

U.S. PATENT DOCUMENTS

2008/0095695 A1* 4/2008 Shanov et al. ............. 423/447.3
2010/0021787 A1* 1/2010 Wu et al. ..................... 429/30
2012/0230908 A1* 9/2012 Ohashi et al. ............. 423/447.3

OTHER PUBLICATIONS

Xuan Wang, et al., "Bimetallic Catalysts for the Efficient Growth of SWNTs on Surfaces", Chem. Mater, 2004, 16, pp. 799-805, Discussed in specification.

Stephanie Reich, et al., "Control the chirality of carbon nanotubes by epitaxial growth", Chemical Physics Letters, 2006, 421, pp. 469-472, Discussed in specification.

Hongwei Zhu, et al., "Atomic-Resolution Imaging of the Nucleation Points of Single-Walled Carbon Nanotubes", Small, 2005, 1, No. 12, pp. 1180-1183, Discussed in specification.

* cited by examiner

SUBSTRATE FOR CARBON NANOTUBE GROWTH AND METHOD FOR MANUFACTURING THE SAME

BACKGROUND OF THE INVENTION

1. Field of the Invention

The present invention relates to a substrate for carbon nanotube growth and a method for manufacturing the same.

2. Description of the Related Art

Carbon nanotubes are substances having such a structure that a graphene sheet in which a plurality of carbon 6-membered rings are bonded in a planar manner is wound in a cylindrical manner, and there are 3 types of carbon nanotubes, armchair type, chiral type, and zigzag type, depending on the winding manner. The 3 types of carbon nanotubes each vary in terms of electric characteristics depending on the diameter and chirality thereof, exhibiting metallic properties or semiconductor properties.

Therefore, in order to obtain carbon nanotubes depending on the intended use, it is necessary to control diameter and chirality. In order to control the diameter and chirality of the carbon nanotubes, there is known a metal particle as a catalyst, wherein a crystal plane is used on which constituent elements of the metal particle are arranged in a triangle lattice (see, for example, Japanese Patent No. 4979296, Stephanie Reich, Lan Li, and John Robertson, "Control the chirality of carbon nanotubes by epitaxial growth", Chemical Physics Letters, 2006, 421, pp. 469-472).

As a substrate for carbon nanotube growth in which the metal particle including the crystal plane is used as a catalyst, there is known a substrate obtained by forming a $SiO_2$ film and a Co film in this order on the surface of each of $SiO_2$ nanoparticles arranged on a base plate, and heat-treating the resultant to thereby form Co nanoparticles on the $SiO_2$ film (see, for example, Hongwei Zhu, Kazutomo Suenaga, Ayako Hashimoto, Kouki Urita, Kenji Hata, and Sumio Iijima, "Atomic-Resolution Imaging of the Nucleation Points of Single-Walled Carbon Nanotubes", Small, 2005, 1, No. 12, pp. 1180-1183).

As another substrate for carbon nanotube growth, there is known a substrate obtained by applying a solution of a metal chloride as a catalyst and poly(N-vinyl-2-pyrrolidone) in glycol on a base plate and heat-treating the resultant. With respect to the substrate for carbon nanotube growth, while $FeCl_3$ and $H_2PtCl_6 \cdot 6H_2O$ can be used for the metal chloride to thereby provide a substrate including Fe and Pt nanoparticles, $FeCl_3$ and $RuCl_3 \cdot 3H_2O$ can be used therefor to thereby provide a substrate including Fe and Ru nanoparticles (see, for example, Xuan Wang, Wendo Yue, Maoshuai He, manhong Liu, Jin Zhang, and Zhongfan Liu, "Bimetallic Catalysts for the Efficient Growth of SWNTs on Surfaces", Chem. Mater, 2004, 16, pp. 799-805).

However, the conventional substrates for carbon nanotube growth have a disadvantage that the metal particles as a catalyst aggregate due to heat during the production of carbon nanotubes to make it impossible to produce carbon nanotubes having a small diameter at a high density.

SUMMARY OF THE INVENTION

An object of the present invention is to provide a substrate for carbon nanotube growth which can overcome such a disadvantage to produce carbon nanotubes having a small diameter at a high density in which no metal particles as a catalyst aggregates, and a method for manufacturing the substrate.

In order to achieve such an object, the present invention provides a substrate for carbon nanotube growth including a base plate and a catalyst disposed on the base plate, the substrate including a catalyst having a transition metal, a form-defining material layer which is formed on the base plate to define a form which allows the catalyst to be dispersed and arranged, and a covering layer which has a metal oxide to cover the surface of the catalyst.

Since the substrate for carbon nanotube growth of the present invention includes on the base plate the form-defining material layer which allows the catalyst to be dispersed and arranged, the form-defining material layer can prevent the catalyst from aggregating. In general, it is known that carbon nanotubes are grown by dissolving the carbon content thereof in metal particles as a catalyst for oversaturation. Since the substrate for carbon nanotube growth of the present invention includes the covering layer which has the metal oxide on the surface of the catalyst, the covering layer can suppress dissolution of the carbon content in the catalyst and grow carbon nanotubes having a small diameter.

Accordingly, the substrate for carbon nanotube growth of the present invention can grow carbon nanotubes having a small diameter at a high density.

In the substrate for carbon nanotube growth of the present invention, the form-defining material layer preferably controls the plane direction of the crystal structure of the catalyst to thereby define the form of the catalyst. According to the substrate for carbon nanotube growth of the present invention, the form-defining material layer controls the plane direction of the crystal structure of the catalyst, thereby making it possible to control the diameter and chirality of carbon nanotubes to be grown on the substrate, and to provide carbon nanotubes having metallic properties.

In the substrate for carbon nanotube growth of the present invention, the catalyst is a transition metal, and for example, a catalyst having an iron group element can be used therefor. As the iron group element, any of Fe, Co, and Ni may be used.

In the substrate for carbon nanotube growth of the present invention, for example, a base plate having MgO (100) single crystal can be used as the base plate. MgO (100) single crystal has a lattice constant close to that of the iron group element, and thus is suitable for the base plate.

In the substrate for carbon nanotube growth of the present invention, the material for use in the form-defining material layer is desirably the same as that for the base plate, and for example, when the base plate has MgO (100) single crystal, one having MgO can be used for the form-defining material layer.

In the substrate for carbon nanotube growth of the present invention, the covering layer may be one having any metal oxide such as $MgFe_2O_4$, $\gamma-Fe_2O_3$, and $Fe_3O_4$.

In the substrate for carbon nanotube growth of the present invention, the covering layer preferably has a thickness ranging from 0.2 to 5.0 nm When the thickness of the covering layer is less than 0.2 nm, dissolution of the carbon content in the catalyst cannot be sufficiently suppressed, and carbon nanotubes having a small diameter and metallic properties cannot be obtained in some cases. On the other hand, when the thickness of the covering layer exceeds 5.0 nm, an effect of suppressing dissolution of the carbon content in the catalyst is excessively exerted, causing relatively too less dissolution of the carbon content in the catalyst and making growth of carbon nanotubes by itself difficult in some cases.

The method for manufacturing a substrate for carbon nanotube growth of the present invention is a method for manufacturing a substrate for carbon nanotube growth including a base plate and a catalyst disposed on the base plate, the method including a step of sputtering on the base plate a metal which forms the catalyst and oxidizing the surface of the metal, a step of sputtering on the base plate a form-defining material which defines a form which allows the catalyst to be dispersed and arranged, and a step of further sputtering on the form-defining material a metal which forms the catalyst and oxidizing the surface of the metal.

According to the method for manufacturing a substrate for carbon nanotube growth of the present invention, first, a metal which forms the catalyst is sputtered on the base plate and the surface of the metal is oxidized, and the form-defining material is sputtered. Then, a metal which forms the catalyst is further sputtered on the form-defining material and the surface of the metal is oxidized, thereby exhibiting such a behavior that the form-defining material is reconstructed by heat of the sputtering to run around below the metal including a metal oxide layer on the surface thereof, thereby being integrated with the base plate.

As a result, the metal is made into particles to form a catalyst which includes a covering layer having a metal oxide on the surface thereof, and the form-defining material forms a form-defining material layer which defines a form which allows the catalyst to be dispersed and arranged. A part of the catalyst is herein embedded in the form-defining material layer, thereby making it possible to prevent the catalyst from aggregating and to control the plane direction of the crystal structure of the catalyst by the form-defining material layer.

In the method for manufacturing a substrate for carbon nanotube growth of the present invention, the step of sputtering a form-defining material which defines a form which allows the catalyst to be dispersed and arranged and the step of further sputtering on the form-defining material a metal which forms the catalyst and oxidizing the surface of the metal are preferably repeated in a plurality of times.

According to the method for manufacturing a substrate for carbon nanotube growth of the present invention, the step of sputtering the form-defining material and the step of further sputtering on the form-defining material a metal which forms the catalyst and oxidizing the surface of the metal are repeated in a plurality of times, thereby making it possible to control the particle size of the catalyst.

DETAILED DESCRIPTION OF THE PREFERRED EMBODIMENTS

Then, embodiments of the present invention will be described in more detail with reference to the accompanied drawings.

Figure 1:
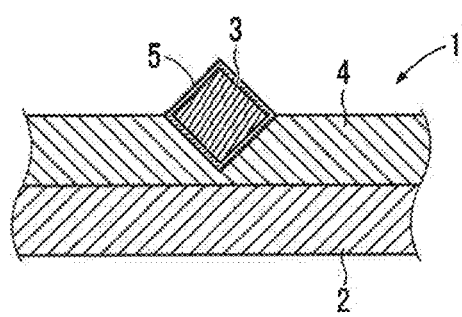
FIG. 1 is an illustrative cross-sectional view illustrating a configuration of a substrate for carbon nanotube growth according to the present invention.

As illustrated in FIG. 1, a substrate for carbon nanotube growth 1 of the present embodiment includes a catalyst 3 disposed on a base plate 2, a form-defining material layer 4 which defines a form which allows the catalyst 3 to be dispersed and arranged, and a covering layer 5 which covers the surface of the catalyst 3.

In the present embodiment, the catalyst 3 consists of a transition metal, and for example, an iron group element can be used therefor. As the iron group element, any of Fe, Co, and Ni may be used. When the catalyst 3 consists of the transition metal, the base plate 2 which can be used is one having a lattice constant close to that of the transition metal which forms the catalyst 3, and examples of such base plate 2 include one having MgO (100) single crystal.

In this case, the form-defining material layer 4 desirably has the same material as the base plate 2. Accordingly, when the base plate 2 has MgO (100) single crystal, the form-defining material layer 4 also desirably has MgO.

In this case, a metal oxide which forms the covering layer 5 may consist of, for example, any metal oxide such as $MgFe_2O_4$, $\gamma-Fe_2O_3$, and $Fe_3O_4$.

The form-defining material layer 4 has a part of the catalyst 3 embedded therein, thereby defining a form which allows the catalyst 3 to be dispersed and arranged, and controlling the plane direction of the crystal structure of the catalyst 3. As a result, the catalyst 3 has a regular octahedron shape in the case of consisting of any of Fe, Co, and Ni, and thus the {111} plane thereof is exposed from the form-defining material layer 4.

According to the substrate for carbon nanotube growth 1 of the present embodiment, since a part of the catalyst 3 is embedded in the form-defining material layer 4, and dispersed and arranged therein, the catalyst 3 can be prevented from aggregating and a carbon nanotube forest can be produced. In addition, the surface of the catalyst 3 is covered with the covering layer 5 having the metal oxide, thereby making it possible to suppress dissolution of the carbon content in the catalyst 3, and to allow carbon nanotubes, to be produced, to have a small diameter. In addition, since the plane direction of the crystal structure of the catalyst 3 is controlled by the form-defining material layer 4, the diameter, chirality, and the like of carbon nanotubes to be produced can be controlled.

The "carbon nanotube forest" herein means aggregate of carbon nanotubes produced on the substrate for carbon nanotube growth 1 in the perpendicular orientation at a high density.

Then, a method for manufacturing a substrate for carbon nanotube growth 1 of the present embodiment will be described.

In the manufacturing method of the present embodiment, first, for example, any of Fe, Co, and Ni is sputtered as a transition metal on a base plate 2 having, for example, MgO (100) at a temperature ranging from 650 to 800° C., for example, at a temperature of 740° C. using a high-vacuum magnetron sputtering apparatus. Then, oxygen-containing gas is passed through the high-vacuum magnetron sputtering apparatus to thereby oxidize the surface of the transition metal.

Then, a form-defining material consists of, for example, MgO is sputtered at around room temperature (100° C. or lower) using the high-vacuum magnetron sputtering apparatus. Then, the transition metal is further sputtered on the form-defining material in the same manner as described above and the surface of the transition metal is oxidized in the same manner as described above.

Thus, MgO of the form-defining material sputtered at room temperature exhibits such a behavior that it is reconstructed by heat during the next sputtering of the transition metal to run around below the transition metal whose surface is oxidized, thereby being integrated with MgO of the base plate 2. Such a behavior of MgO allows the transition metal to be made into particles to form a catalyst 3 which includes a covering layer 5 having a metal oxide on the surface, and allows the MgO to form a form-defining material layer 4 which defines a form which allows the catalyst 3 to be dispersed and arranged. A part of the catalyst 3 is here embedded in the form-defining material layer 4, thereby making it possible to prevent the catalyst 3 from aggregating and to control the plane direction of the crystal structure of the catalyst 3 by the form-defining material layer 4.

In the manufacturing method of the present embodiment, after the transition metal is sputtered and the surface thereof is oxidized, a step of sputtering the form-defining material, and a step of further sputtering the transition metal on the form-defining material and oxidizing the surface thereof may be repeated in a plurality of times. This makes it possible to control the particle size of the catalyst 3.

Then, Example of the present invention and Comparative Example thereof will be described.

EXAMPLE 1

In the present Example, first, Fe was sputtered on a base plate 2 having MgO (100) at a temperature of 740° C. using a high-vacuum magnetron sputtering apparatus so that the thickness was 1.0 nm, and thereafter, oxygen-containing gas having 95% by volume of Ar and 5% by volume of $O_2$ was fed thereto to oxidize the surface of the Fe layer formed by the sputtering. Then, a form-defining material having MgO was sputtered at room temperature (65° C.) so that the thickness was 1.0 nm. Then, Fe was further sputtered on the form-defining material at a temperature of 740° C. so that the thickness was 1.0 nm, and thereafter, the oxygen-containing gas was fed thereto to oxidize the surface of the Fe layer formed by the sputtering.

As a result, obtained was a substrate for carbon nanotube growth 1 including on the base plate 2, a catalyst 3, a form-defining material layer 4 which defines a form which allows the catalyst 3 to be dispersed and arranged, and a covering layer 5 which covers the surface of the catalyst 3. A transmission electron microscope photograph of the resulting substrate for carbon nanotube growth 1 is shown in FIG. 2.

Figure 2:
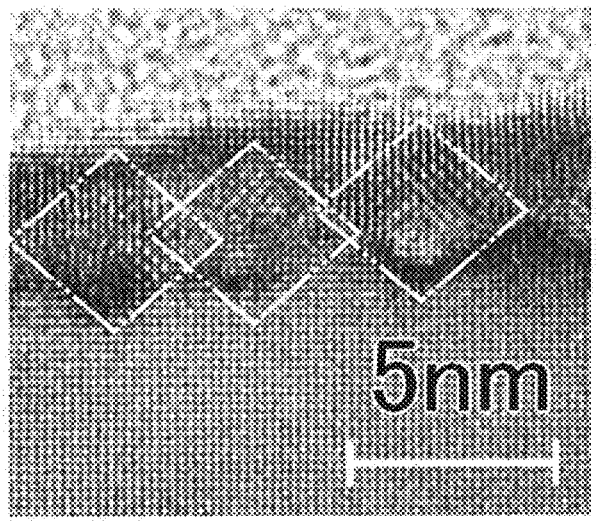
FIG. 2 is a transmission electron microscope photograph showing a cross-section structure of a substrate for carbon nanotube growth obtained in Example 1.
Figure 3:
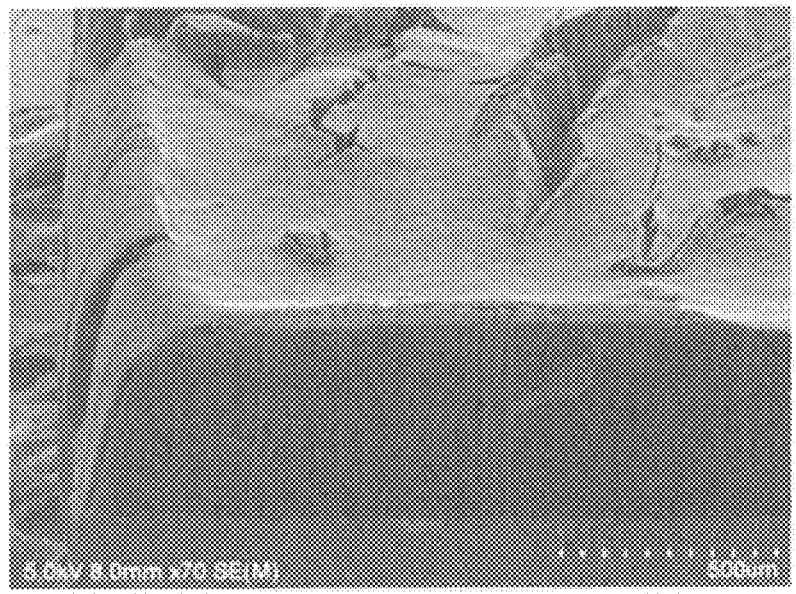
FIG. 3 is a scanning electron microscope photograph showing carbon nanotubes grown on the substrate for carbon nanotube growth obtained in Example 1.

It is clear from FIG. 2 that regular octahedron particles having a maximum diameter of 5 nm with the {111} plane exposed on the surface thereof are epitaxially grown on the substrate for carbon nanotube growth 1 obtained in the present Example. The regular octahedron particles were subjected to energy dispersive X-ray analysis (EDX), and found to include the catalyst 3 consisting of Fe and the covering layer 5 consisting of $MgFe_2O_4$ which covers the surface of the catalyst 3, the covering layer 5 having an average thickness of 2 nm Then, the substrate for carbon nanotube growth 1 obtained in the present Example was placed on a plasma CVD apparatus set at a base plate temperature of 730° C. and an output of plasma CVD of 100 W, and gas having 10% by volume of methane and 90% by volume of hydrogen was fed thereto to synthesis carbon nanotubes for 30 minutes. A scanning microscope photograph of the resulting carbon nanotubes is shown in FIG. 3. It is clear from FIG. 3 that the substrate for carbon nanotube growth 1 obtained in the present Example is used to thereby produce a carbon nanotube forest having a length of about 500 μm.

Figure 4:
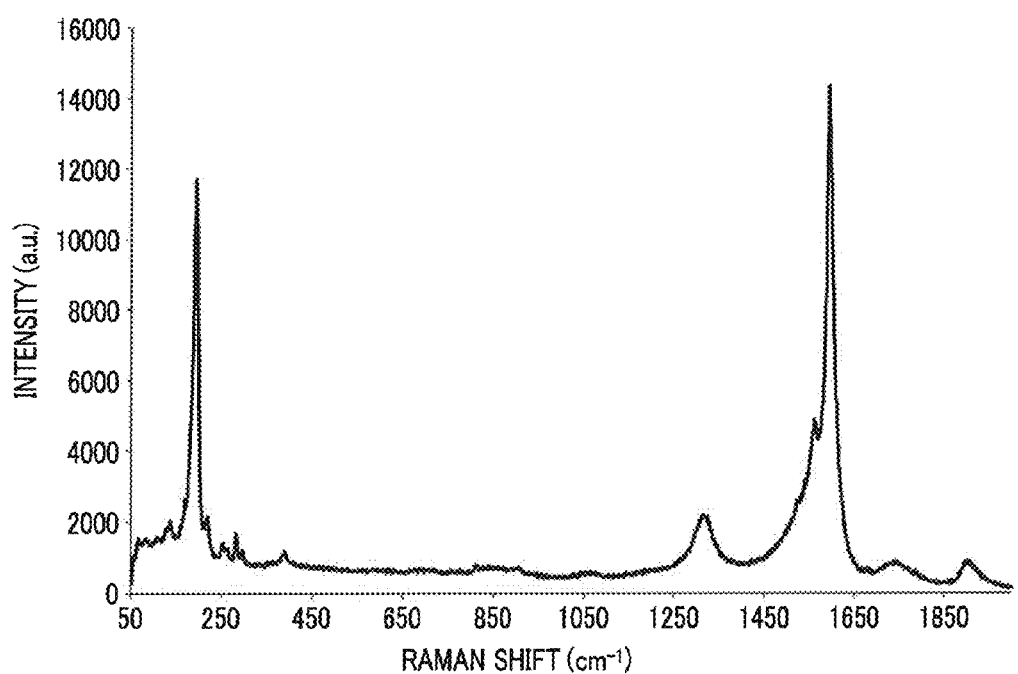
FIG. 4 is a Raman spectrum of the carbon nanotubes obtained in Example 1.

Then, a Raman spectrum (laser excitation wavelength: 632 nm) of the carbon nanotubes obtained in the present Example is shown in FIG. 4. It is clear from FIG. 4 that the carbon nanotubes obtained in the present Example are single layer carbon nanotubes. In addition, it is clear from broad radial breathing mode (RBM) observed at around 190 $cm^{-1}$ in the Raman spectrum shown in FIG. 4 that the carbon nanotubes obtained in the present Example exhibit metallic properties.

COMPARATIVE EXAMPLE 1

In the present Comparative Example, first, Al was sputtered on a Si base plate at a temperature of 25° C. using a high-vacuum magnetron sputtering apparatus so that the thickness was 5.0 nm. Then, Fe was sputtered thereon at a temperature of 25° C. so that the thickness was 1.5 nm, and Al was further sputtered thereon at a temperature of 25° C. so that the thickness was 1.0 nm, to thereby provide a substrate for carbon nanotube growth. A transmission electron microscope photograph of the resulting substrate for carbon nanotube growth is shown in FIG. 5.

Figure 5:
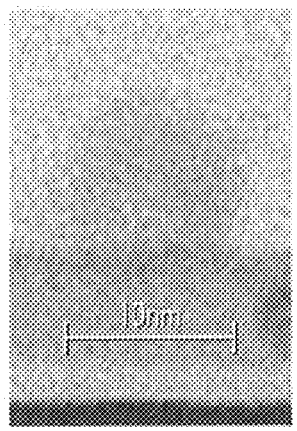
FIG. 5 is a transmission electron microscope photograph showing a cross-section structure of a substrate for carbon nanotube growth obtained in Comparative Example 1.

It is clear from FIG. 5 that the substrate for carbon nanotube growth obtained in the present Comparative Example includes spherical particles. The particles were subjected to EDX, and found not to be sufficiently embedded in the base plate, to have a composition of 100% by atom of Fe, and not to include a defined covering layer having a metal oxide on the surface thereof.

Then, carbon nanotubes were synthesized in exactly the same manner as in Example 1 except that the substrate for carbon nanotube growth obtained in the present Comparative Example was used, but the resulting carbon nanotubes were carbon nanotubes including various numbers of layers, and a single layer carbon nanotube forest dominantly having a specified structure was not produced.

What is claimed is:
1. A method for manufacturing a substrate for carbon nanotube growth comprising a base plate and a catalyst disposed on the base plate, the method comprising:
   a primary metal sputtering step of sputtering on the base plate a first metal which forms the catalyst;
   a primary oxidizing step of, after the primary metal sputtering step, oxidizing a surface of the first metal to form a first metal oxide layer on the surface of the first metal;
   a form-defining material sputtering step of, after the primary oxidizing step, sputtering on the base plate a form-defining material which defines a form which allows the catalyst to be dispersed and arranged;
   a secondary metal sputtering step of, after the form-defining material sputtering step, sputtering on the form-defining material a second metal which forms the catalyst; and
   a secondary oxidizing step of, after the secondary metal sputtering step, oxidizing a surface of the catalyst in which the first metal and the second metal is integrated to form a catalyst oxide layer on the surface of the catalyst,
   wherein the secondary metal sputtering step causes the form-defining material to reach an area below the first metal, including the first metal oxide layer on the surface of the first metal, thereby being integrated with the base plate.
2. The method for manufacturing a substrate for carbon nanotube growth according to claim 1, wherein the form-defining material sputtering step, the secondary metal sputtering step, and the secondary oxidizing step are repeated a plurality of times.

3. The method for manufacturing a substrate for carbon nanotube growth according to claim 1, wherein the first metal and the second metal which form the catalyst consist of a transition metal.

4. The method for manufacturing a substrate for carbon nanotube growth according to claim 1, wherein the first metal and the second metal which form the catalyst consist of an iron group element.

5. The method for manufacturing a substrate for carbon nanotube growth according to claim 4, wherein the iron group element is Fe.

6. The method for manufacturing a substrate for carbon nanotube growth according to claim 1, wherein the base plate consists of MgO (100) single crystal.

7. The method for manufacturing a substrate for carbon nanotube growth according to claim 1, wherein the form-defining material is the same material as the base plate.

8. The method for manufacturing a substrate for carbon nanotube growth according to claim 1, wherein the form-defining material is MgO.

9. The method for manufacturing a substrate for carbon nanotube growth according to claim 1, wherein the secondary oxidizing step prevents the catalyst from aggregating and controls a plane direction of a crystal structure of the catalyst.

10. The method for manufacturing a substrate for carbon nanotube growth according to claim 1, wherein the form-defining material is sputtered at room temperature, whereas the first metal and the second metal which form the catalyst are sputtered at a temperature greater than room temperature at which the form defining material reaches an area below the first metal, including the first metal oxide layer on the surface of the first metal, thereby being integrated with the base plate.

* * * * *